(12) United States Patent
Choi et al.

(10) Patent No.: US 10,720,086 B2
(45) Date of Patent: Jul. 21, 2020

(54) DISPLAY DEVICE USING SEMICONDUCTOR LIGHT-EMITTING DIODE

(71) Applicant: LG ELECTRONICS INC., Seoul (KR)

(72) Inventors: Hwanjoon Choi, Seoul (KR); Yonghan Lee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 16/129,983

(22) Filed: Sep. 13, 2018

(65) Prior Publication Data

US 2019/0088168 A1 Mar. 21, 2019

(30) Foreign Application Priority Data

Sep. 15, 2017 (KR) .................. 10-2017-0118888

(51) Int. Cl.
| H01L 29/18 | (2006.01) |
| G09F 9/33 | (2006.01) |
| G09F 9/30 | (2006.01) |
| H01L 33/62 | (2010.01) |
| H01L 25/075 | (2006.01) |
| G09G 3/20 | (2006.01) |
| H01L 33/32 | (2010.01) |

(52) U.S. Cl.
CPC .............. *G09F 9/33* (2013.01); *G09F 9/301* (2013.01); *G09G 3/2003* (2013.01); *H01L 25/0753* (2013.01); *H01L 33/62* (2013.01); *H01L 33/32* (2013.01)

(58) Field of Classification Search
CPC .............. H01L 25/0753; H01L 25/048; H01L 27/3255; H01L 27/3279
See application file for complete search history.

(56) References Cited

U.S. PATENT DOCUMENTS

2017/0336690 A1* 11/2017 Lee ..................... H01L 25/0753
2018/0294381 A1* 10/2018 Wu ..................... H01L 23/5384

* cited by examiner

*Primary Examiner* — Allen L Parker
*Assistant Examiner* — Wasiul Haider
(74) *Attorney, Agent, or Firm* — Birch, Stewart, Kolasch & Birch, LLP

(57) ABSTRACT

A display device including a plurality of vertical type semiconductor light-emitting diodes; a plurality of horizontal type semiconductor light-emitting diodes; a first wiring formed on a substrate and including a plurality of electrode lines, a first electrode line being connected with first conductive electrodes of the vertical type semiconductor light-emitting diodes and a second electrode line being connected with first conductive electrodes of the horizontal type semiconductor light-emitting diodes; a second wiring spaced apart from and crossing the first wiring and electrically connected with second conductive electrodes of the vertical type semiconductor light-emitting diodes; and a third wiring formed on the substrate, electrically connected with the second wiring, and connected with second conductive electrodes of the horizontal type semiconductor light-emitting diodes.

19 Claims, 15 Drawing Sheets

DISPLAY DEVICE USING SEMICONDUCTOR LIGHT-EMITTING DIODE

CROSS-REFERENCE TO RELATED APPLICATION

Pursuant to 35 U.S.C. § 119(a), this application claims the benefit of an earlier filing date and priority to Korean Application No. 10-2017-0118888 filed in the Republic of Korea on Sep. 15, 2017, the contents of which are incorporated by reference herein in its entirety.

BACKGROUND OF THE INVENTION

1. Field of the Invention

The present invention relates to a display device, and more particularly, to a display device using a semiconductor light-emitting diode.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light-emitting diodes (AMOLEDs). However, there exist problems such as not-so-fast response time, difficult implementation of flexibility in case of LCDs, and there exist drawbacks such as short life span, not-so-good yield as well as low flexibility in case of AMOLEDs.

Further, light-emitting diodes (LEDs) are well known light-emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light-emitting diodes may be used to implement a flexible display, thereby presenting a scheme for solving the problems.

In addition, an emission mode for emitting red light, green light and blue light using a red semiconductor light-emitting diode, a green semiconductor light-emitting diode and a blue semiconductor light-emitting diode may be applied to a display device using a semiconductor light-emitting diode when the display device is implemented. In this instance, since at least one of the semiconductor light-emitting diodes may have physical characteristic different from those of the other light-emitting diodes, a problem may occur when the display device is implemented by the same manufacturing method. As such an example, a vertical type semiconductor light-emitting diode needs heat-treatment of 400° C. or more for ohmic contact of an n type electrode. However, a problem occurs in that an adhesive used in the course of transferring a red semiconductor light-emitting diode cannot endure such a temperature.

Further, the semiconductor light-emitting diode may have a defect. In this instance, an exchange repair mode for attaching a new semiconductor light-emitting diode after removing a semiconductor light-emitting diode having a defect may be used. In case of the vertical type semiconductor light-emitting diode, technical difficulty is high during exchange repair, whereby additional facility investment and separate chip design are required. For this reason, a problem occurs in that cost is increased.

SUMMARY OF THE INVENTION

An object of the present invention is to provide a novel mechanism to which a simpler process can be applied in a display device using a red semiconductor light-emitting diode, a green semiconductor light-emitting diode, and a blue semiconductor light-emitting diode.

Another object of the present invention is to provide a structure that can easily remove and exchange a semiconductor light-emitting diode having a defect using an exchange repair mode.

To achieve the objects of the present invention, in the present invention, a horizontal type semiconductor light-emitting diode and a vertical type semiconductor light-emitting diode are used together, and a first wiring, a second wiring and a third wiring are used as a wiring structure suitable for the semiconductor light-emitting diodes.

In more detail, a display device according to an embodiment of the present invention includes a plurality of vertical type semiconductor light-emitting diodes; at least one horizontal type semiconductor light-emitting diode; a first wiring formed on a substrate and connected with first conductive electrodes of the vertical type semiconductor light-emitting diodes under the vertical type semiconductor light-emitting diodes; a second wiring arranged to cross the first wiring and electrically connected with second conductive electrodes of the vertical type semiconductor light-emitting diodes over the vertical type semiconductor light-emitting diodes; a third wiring formed on the substrate and electrically connected with the second wiring. The first wiring and the third wiring are arranged to be connected with first and second conductive electrodes of the horizontal type semiconductor light-emitting diode on the substrate.

According to the present invention configured as above, the display device can be manufactured using the red semiconductor light-emitting diode, the green semiconductor light-emitting diode and the blue semiconductor light-emitting diode. Therefore, a process for displaying a color in the display device may be simplified. Also, the vertical type semiconductor light-emitting diode favorable for multiple divisions is used as a base, and the horizontal type semiconductor light-emitting diode is applied to a red color that needs a special material during division, whereby the structure which may easily be manufactured while having a competitive cost may be implemented.

Also, in the present invention, as the vertical type semiconductor light-emitting diode is repaired using the horizontal type semiconductor light-emitting diode, the semiconductor light-emitting diode having a defect can be exchanged without any problem. Moreover, the process cost can be reduced.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
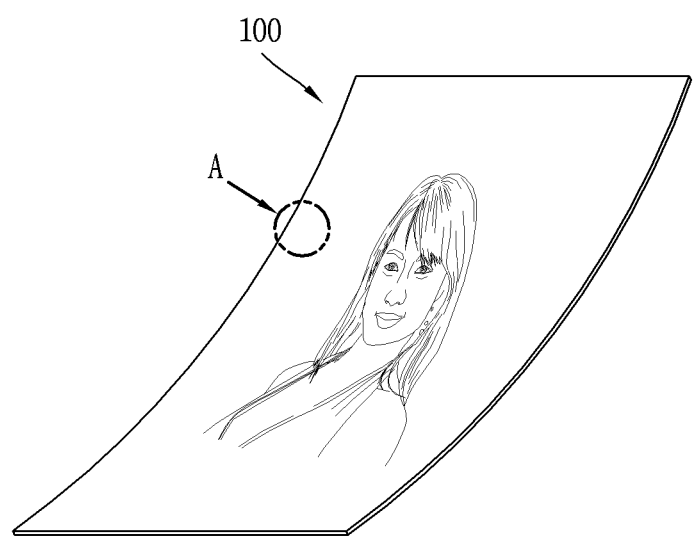
FIG. 1 is a conceptual view illustrating a display device using a semiconductor light-emitting diode according to an embodiment of the present invention.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. Also, it should be noted that the accompanying drawings are merely illustrated to easily explain the concept of the invention, and therefore, they should not be construed to limit the technological concept disclosed herein by the accompanying drawings.

Furthermore, when an element such as a layer, region or substrate is referred to as being "on" another element, it can be directly on the another element or an intermediate element may also be interposed therebetween. A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light-emitting diode according to an embodiment of the present disclosure. According to the drawing, information processed in the controller of the display device 100 may be displayed using a flexible display. The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be realized so a light emission of each unit pixel (sub-pixel) arranged in a matrix configuration is controlled independently. The unit pixel denotes an elementary unit for representing one color.

The sub-pixel of the flexible display may be implemented by a semiconductor light-emitting diode. According to the present disclosure, a light-emitting diode (LED) is illustrated as a type of semiconductor light-emitting diode. The light-emitting diode may be formed with a small size to perform the role of a sub-pixel even in the second configuration through this.

Hereinafter, a flexible display implemented using the light-emitting diode will be described in more detail with reference to the accompanying drawings. In particular, FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light-emitting diode in FIG. 3A, and FIGS. 5A through 5C are conceptual views illustrating various forms for implementing colors in connection with a flip-chip type semiconductor light-emitting diode.

Figure 2:
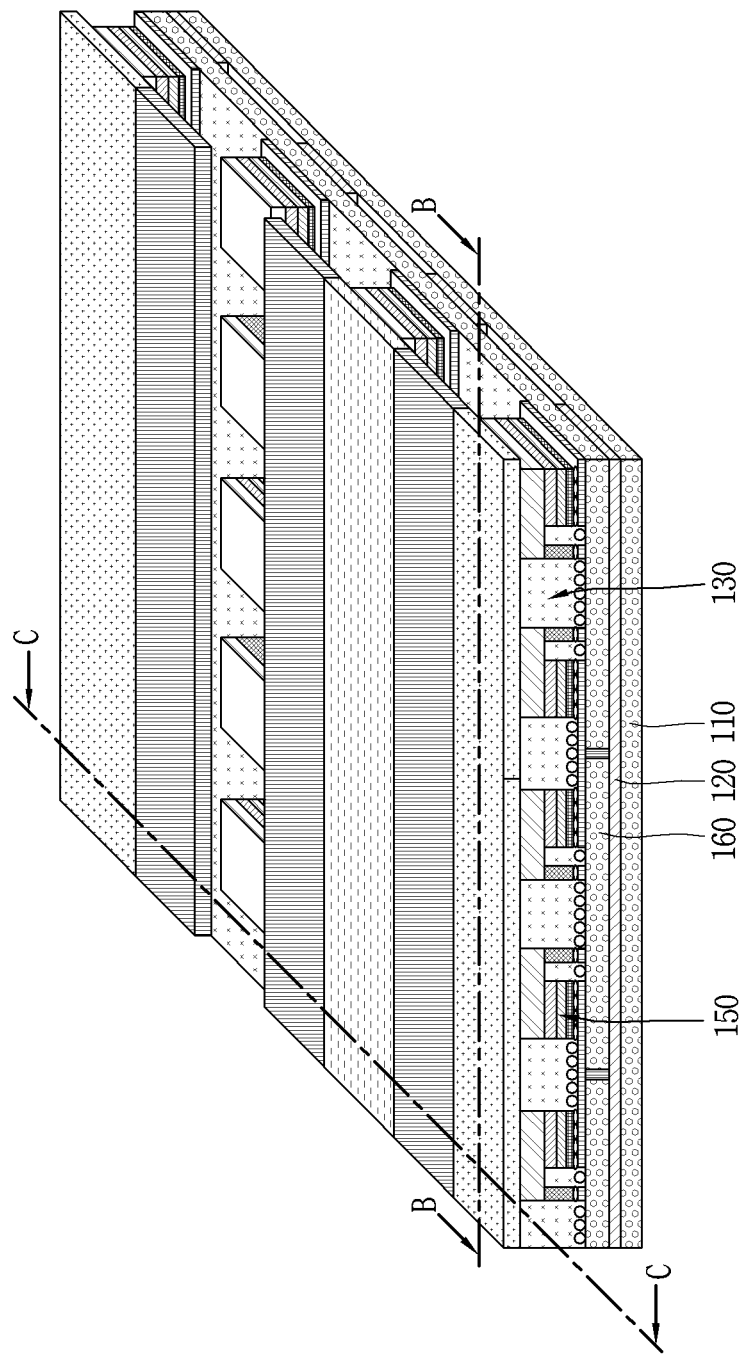
FIG. 2 is a partial enlarged view of portion "A" in FIG. 1, and FIGS. 3A and 3B are cross-sectional views taken along lines B-B and C-C in FIG. 2.
Figure 3A:
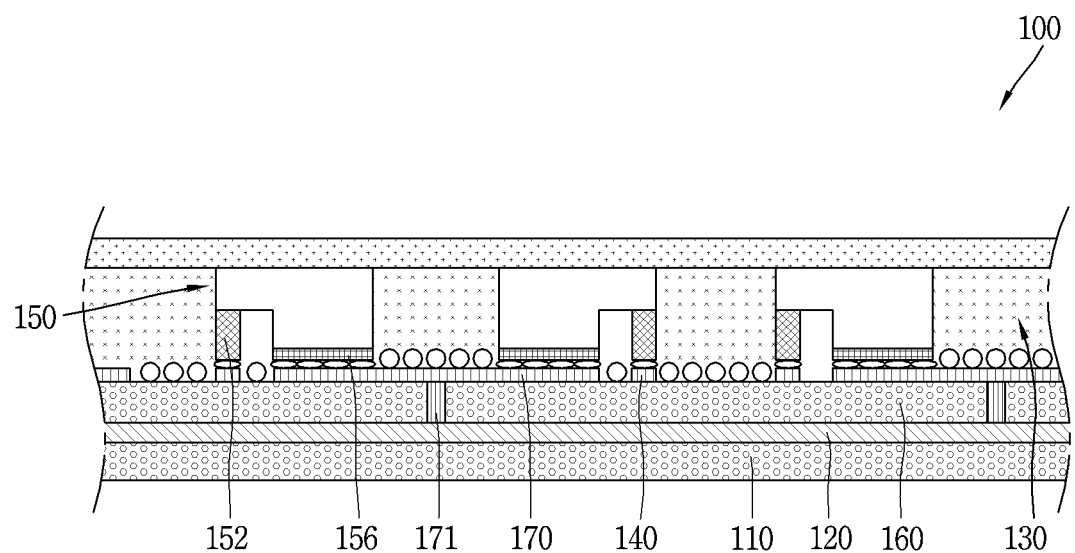
Figure 3B:
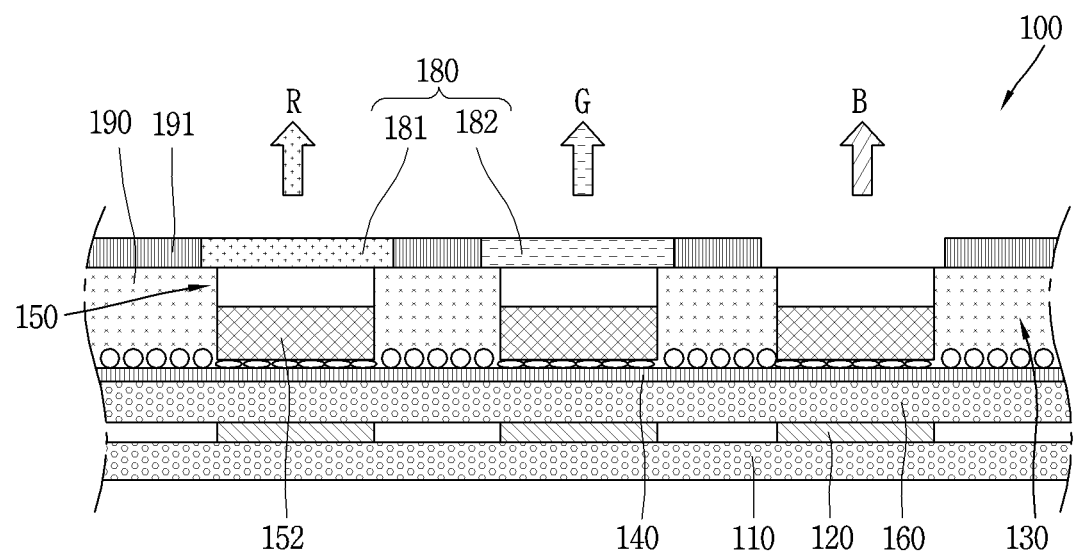
Figure 4:
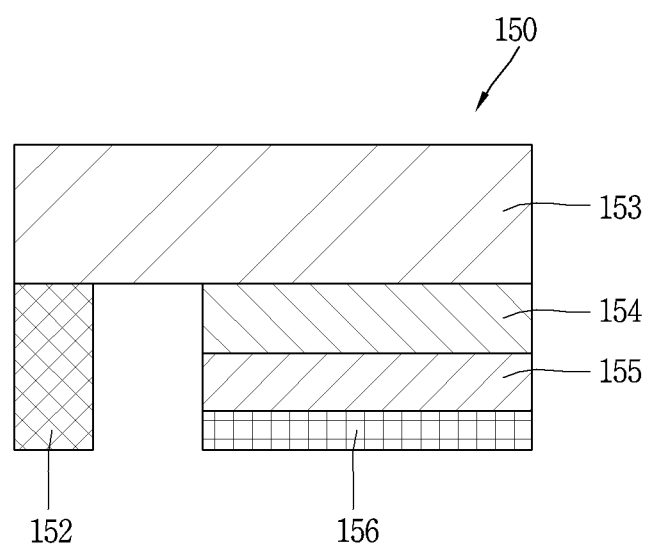
FIG. 4 is a conceptual view illustrating a flip-chip type semiconductor light-emitting diode in FIGS. 3A and 3B.

FIGS. 2, 3A and 3B illustrate a display device 100 using a passive matrix (PM) type semiconductor light-emitting diode as a display device 100 using a semiconductor light-emitting diode. However, an example described below may also be applicable to an active matrix (AM) type semiconductor light-emitting diode.

As shown, the display device 100 includes a substrate 110, a first electrode 120, a conductive adhesive layer 130, a second electrode 140, and a plurality of semiconductor light-emitting diodes 150. The substrate 110 may be a flexible substrate and contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 can be a wiring substrate disposed with the first electrode 120, and thus the first electrode 120 can be placed on the substrate 110. According to the drawing, an insulating layer 160 is disposed on the substrate 110 placed with the first electrode 120, and an auxiliary electrode 170 is placed on the insulating layer 160. In this instance, a configuration in which the insulating layer 160 is deposited on the substrate 110 may be a single wiring substrate. More specifically, the insulating layer 160 can be incorporated into the substrate 110 with an insulating and flexible material such as polyimide (PI), PET, PEN or the like to form a single wiring substrate.

Further, the auxiliary electrode 170 as an electrode for electrically connecting the first electrode 120 to the semiconductor light-emitting diode 150 is placed on the insulating layer 160, and disposed to correspond to the location of the first electrode 120. For example, the auxiliary electrode 170 has a dot shape, and is electrically connected to the first electrode 120 by an electrode hole 171 passing through the insulating layer 160. The electrode hole 171 may be formed by filling a conductive material in a via hole.

Referring to the drawings, the conductive adhesive layer 130 is formed on one surface of the insulating layer 160, but the present disclosure is not limited to this. For example, it is possible to also have a structure in which the conductive adhesive layer 130 is disposed on the substrate 110 with no insulating layer 160. In addition, the conductive adhesive layer 130 performs the role of an insulating layer in the structure in which the conductive adhesive layer 130 is disposed on the substrate 110.

The conductive adhesive layer 130 may be a layer having adhesiveness and conductivity, and thus, a conductive material and an adhesive material can be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 allows electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film includes an anisotropic conductive medium mixed with an insulating base member, and thus when heat and pressure are applied thereto, only a specific portion thereof can have conductivity by the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in this example, the anisotropic conductive film is a film with a form in which an anisotropic conductive medium is mixed with an insulating base member, and thus when heat and pressure are applied thereto, only a specific portion thereof has conductivity by the conductive balls. The anisotropic conductive film may be in a state in which a core with a conductive material contains a plurality of particles coated by an insulating layer with a polymer material, and in this instance, film may have conductivity by the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

In another example, an anisotropic conductive film may be in a state containing a plurality of particles in which a conductive material is coated on insulating cores. In this instance, a portion to which heat and pressure are applied may be converted (pressed and adhered) to a conductive material to have conductivity in the thickness direction of the film. In still another example, the film may be formed to have conductivity in the thickness direction of the film in which a conductive material passes through an insulating base member in the z-direction. In this instance, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure is not limited to this, and the anisotropic conductive film can have a form in which conductive balls are randomly mixed with an insulating base member or a form configured with a plurality of layers in which conductive balls are disposed at any one layer (double-ACF), and the like. Further, the anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140. When the conductive adhesive layer 130 is formed in a state that the auxiliary electrode 170 and second electrode 140 are located, and then the semiconductor light-emitting diode 150 is connect thereto in a flip chip form with the application of heat and pressure, the semiconductor light-emitting diode 150 is electrically connected to the first electrode 120 and second electrode 140.

Referring to FIG. 4, the semiconductor light-emitting diode may be a flip chip type semiconductor light-emitting diode. For example, the semiconductor light-emitting diode may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 can be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light-emitting diodes 150. For example, the left and right p-type electrodes of the semiconductor light-emitting diodes around the auxiliary electrode may be electrically connected to one auxiliary electrode.

More specifically, the semiconductor light-emitting diode 150 is pressed into the conductive adhesive layer 130, and through this, only a portion between the p-type electrode 156 and auxiliary electrode 170 of the semiconductor light-emitting diode 150 and a portion between the n-type electrode 152 and second electrode 140 of the semiconductor light-emitting diode 150 have conductivity, and the remaining portion does not have conductivity since there is no push-down of the semiconductor light-emitting diode. As described above, the conductive adhesive layer 130 may form an electrical connection as well as allow a mutual coupling between the semiconductor light-emitting diode 150 and the auxiliary electrode 170 and between the semiconductor light-emitting diode 150 and the second electrode 140.

Furthermore, a plurality of semiconductor light-emitting diodes 150 constitute a light-emitting array, and a phosphor layer 180 is formed on the light-emitting array. The light-emitting device array may include a plurality of semiconductor light-emitting diodes with different self luminance values. Each of the semiconductor light-emitting diodes 150 constitutes a sub-pixel, and is electrically connected to the first electrode 120. For example, there may exist a plurality of first electrodes 120, and the semiconductor light-emitting diodes are arranged in several rows, for instance, and each row of the semiconductor light-emitting diodes may be electrically connected to any one of the plurality of first electrodes.

Furthermore, the semiconductor light-emitting diodes may be connected in a flip chip form, and thus semiconductor light-emitting diodes grown on a transparent dielectric substrate. Furthermore, the semiconductor light-emitting diodes may be nitride semiconductor light-emitting diodes, for instance. The semiconductor light-emitting diode 150 has an excellent luminance characteristic, and thus it may be possible to configure individual sub-pixels even with a small size thereof.

According to the drawing, a partition wall 190 is formed between the semiconductor light-emitting diodes 150. In this instance, the partition wall 190 divides individual sub-pixels from one another, and can be formed as an integral body with the conductive adhesive layer 130. For example, a base member of the anisotropic conductive film can form the partition wall when the semiconductor light-emitting diode 150 is inserted into the anisotropic conductive film.

Furthermore, when the base member of the anisotropic conductive film is black, the partition wall 190 can have reflective characteristics while at the same time increasing contrast with no additional black insulator. In another example, a reflective partition wall may be separately provided with the partition wall 190. In this instance, the partition wall 190 may include a black or white insulator according to the purpose of the display device. The partition wall 190 has an effect of enhancing reflectivity when the partition wall of the while insulator is used, and increases contrast while at the same time having reflective characteristics.

In addition, the phosphor layer 180 may be located at an outer surface of the semiconductor light-emitting diode 150. For example, the semiconductor light-emitting diode 150 is a blue semiconductor light-emitting diode that emits blue (B) light, and the phosphor layer 180 converts the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light can be deposited on the blue semiconductor light-emitting diode 151 at a location implementing a red sub-pixel, and a green phosphor 182 capable of converting blue light into green (G) light can be deposited on the blue semiconductor light-emitting diode 151 at a location implementing a green sub-pixel. Furthermore, only the blue semiconductor light-emitting diode 151 may be solely used at a location implementing a blue sub-pixel. In this instance, the red (R), green (G) and blue (B) sub-pixels may implement one pixel. More specifically, one color phosphor can be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the present disclosure is not limited to this, and the semiconductor light-emitting diode 150 may be combined with a quantum dot (QD) instead of a phosphor to implement sub-pixels such as red (R), green (G) and blue (B). Furthermore, a black matrix 191 may be disposed between each phosphor layer to enhance contrast. In other words, the black matrix 191 can enhance the contrast of luminance. However, the present disclosure is not limited to this, and another structure for implementing blue, red and green may be also applicable thereto.

Figure 5A:
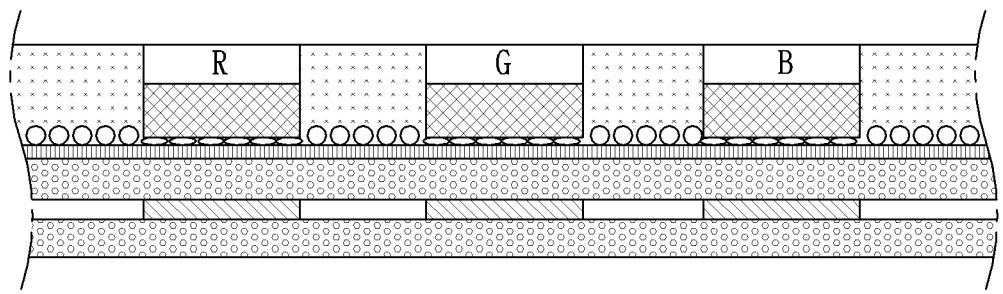
FIGS. 5A through 5C are conceptual views illustrating various forms for implementing colors in connection with a flip-chip type semiconductor light-emitting diode.

Referring to FIG. 5A, each of the semiconductor light-emitting diodes 150 may be implemented with a high-power light-emitting device that emits various lights including blue in which gallium nitride (GaN) is mostly used, and indium (In) and or aluminum (Al) are added thereto. In this instance, the semiconductor light-emitting diode 150 may be red, green and blue semiconductor light-emitting diodes, respectively, to implement each sub-pixel. For instance, red, green and blue semiconductor light-emitting diodes (R, G, B) are alternately disposed, and red, green and blue sub-pixels implement one pixel by means of the red, green and blue semiconductor light-emitting diodes, thereby implementing a full color display.

Figure 5B:
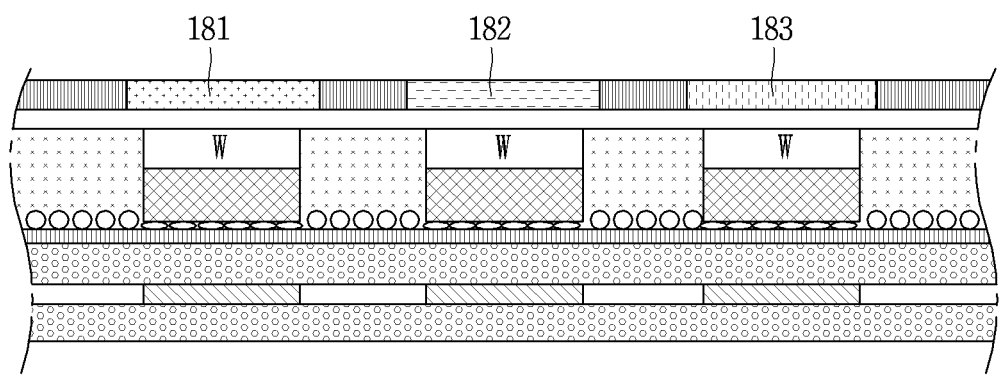

Referring to FIG. 5B, the semiconductor light-emitting diode may have a white light-emitting device (W) provided with a yellow phosphor layer for each element. In this instance, a red phosphor layer 181, a green phosphor layer 182 and blue phosphor layer 183 may be provided on the white light-emitting device (W) to implement a sub-pixel. Furthermore, a color filter repeated with red, green and blue on the white light-emitting device (W) may be used to implement a sub-pixel.

Figure 5C:
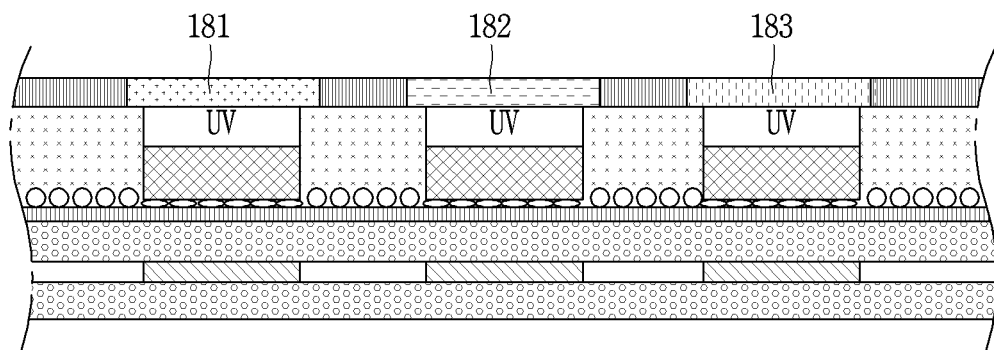

Referring to FIG. 5C, it is possible to also have a structure in which a red phosphor layer 181, a green phosphor layer 182 and blue phosphor layer 183 may be provided on a ultra violet light-emitting device (UV). Thus, the semiconductor light-emitting diode can be used over the entire region up to ultra violet (UV) as well as visible light, and may be extended to a form of semiconductor light-emitting diode in which ultra violet (UV) can be used as an excitation source.

Taking the present example into consideration again, the semiconductor light-emitting diode 150 is placed on the conductive adhesive layer 130 to configure a sub-pixel in the display device. The semiconductor light-emitting diode 150 may have excellent luminance characteristics, and thus it may be possible to configure individual sub-pixels even with a small size thereof. The size of the individual semiconductor light-emitting diode 150 may be less than 80 μm in the length of one side thereof, and formed with a rectangular or square shaped element. In case of a rectangular shaped element, the size thereof may be less than 20×80 μm.

Furthermore, even when a square shaped semiconductor light-emitting diode 150 with a length of side of 10 μm is used for a sub-pixel, it will exhibit a sufficient brightness for implementing a display device. Accordingly, for example, in case of a rectangular pixel in which one side of a sub-pixel is 600 μm in size, and the remaining one side thereof is 300 μm, a relative distance between the semiconductor light-emitting diodes becomes sufficiently large. Accordingly, in this instance, it may be possible to implement a flexible display device having a HD image quality.

Figure 6:
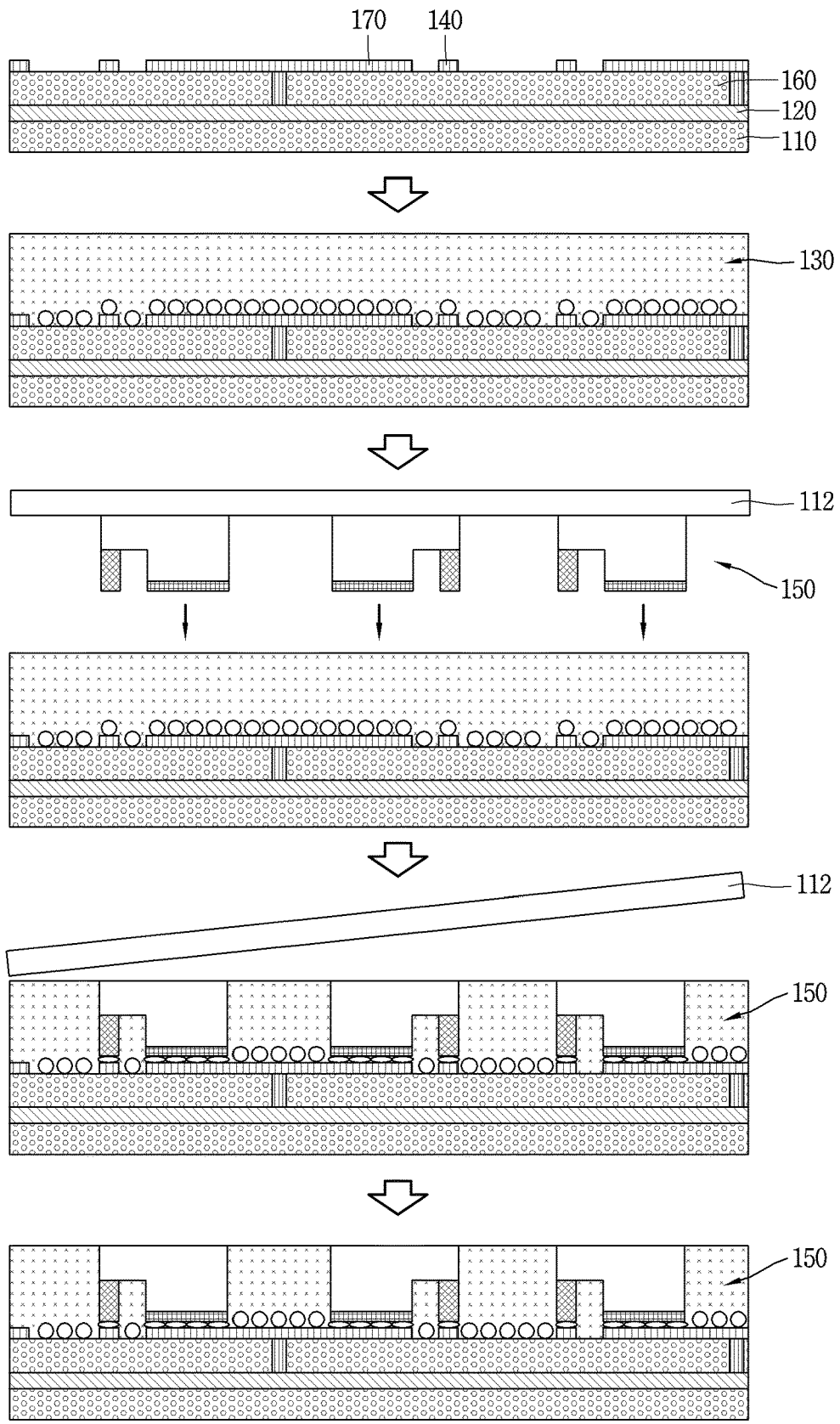
FIG. 6 is cross-sectional views illustrating a fabrication method of a display device using a semiconductor light-emitting diode according to an embodiment of the present invention.

A display device using the foregoing semiconductor light-emitting diode will be fabricated by a new type of fabrication method. Hereinafter, the fabrication method will be described with reference to FIG. 6. In particular, FIG. 6 is cross-sectional views illustrating a fabrication method of a display device using a semiconductor light-emitting diode according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate.

In this instance, the first electrode 120 and second electrode 140 may be disposed in a perpendicular direction to each other. Furthermore, the first substrate 110 and insulating layer 160 may contain glass or polyimide (PI), respectively, to implement a flexible display device. The conductive adhesive layer 130 may be implemented by an anisotropic conductive film, for example, and thus, an anisotropic conductive film may be coated on a substrate located with the insulating layer 160.

Next, a second substrate 112 located with a plurality of semiconductor light-emitting diodes 150 corresponding to the location of the auxiliary electrodes 170 and second electrodes 140 and constituting individual pixels is disposed such that the semiconductor light-emitting diode 150 faces the auxiliary electrode 170 and second electrode 140. In this instance, the second substrate 112 as a growth substrate for growing the semiconductor light-emitting diode 150 may be a sapphire substrate or silicon substrate. The semiconductor light-emitting diode may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light-emitting diode 150 and the auxiliary electrode 170 and second electrode 140 may have conductivity due to the characteristics of an anisotropic conductive film having conductivity by thermal compression, thereby allowing the electrodes and semiconductor light-emitting diode 150 to be electrically connected to each other. At this time, the semiconductor light-emitting diode 150 may be inserted into the anisotropic conductive film, thereby forming a partition wall between the semiconductor light-emitting diodes 150.

Next, the second substrate 112 is removed. For example, the second substrate 112 may be removed using a laser lift-off (LLO) or chemical lift-off (CLO) method. Finally, the second substrate 112 is removed to expose the semiconductor light-emitting diodes 150 to the outside. Silicon oxide (SiOx) or the like may be coated on the wiring substrate coupled to the semiconductor light-emitting diode 150 to form a transparent insulating layer.

An additional process of forming a phosphor layer on one surface of the semiconductor light-emitting diode 150 may be included. For example, the semiconductor light-emitting diode 150 may be a blue semiconductor light-emitting diode for emitting blue (B) light, and red or green phosphor for converting the blue (B) light into the color of the sub-pixel may form a layer on one surface of the blue semiconductor light-emitting diode.

The fabrication method or structure of a display device using the foregoing semiconductor light-emitting diode may be modified in various forms. For example, the foregoing display device may be applicable to a vertical semiconductor light-emitting diode. Hereinafter, the vertical structure will be described with reference to FIGS. 5 and 6. According to the following modified example or embodiment, the same or similar reference numerals are designated to the same or similar configurations to the foregoing example, and the description thereof will be substituted by the earlier description.

Figure 7:
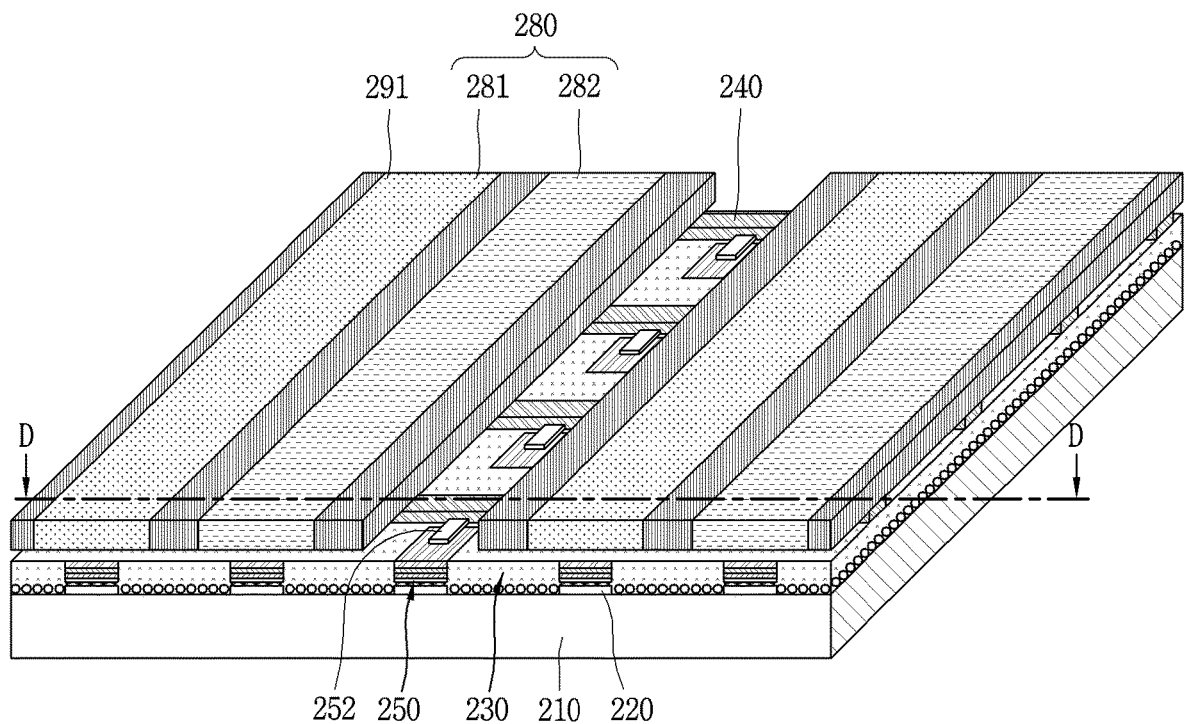
FIG. 7 is a perspective view illustrating a display device using a semiconductor light-emitting diode according to another embodiment of the present invention.
Figure 8:
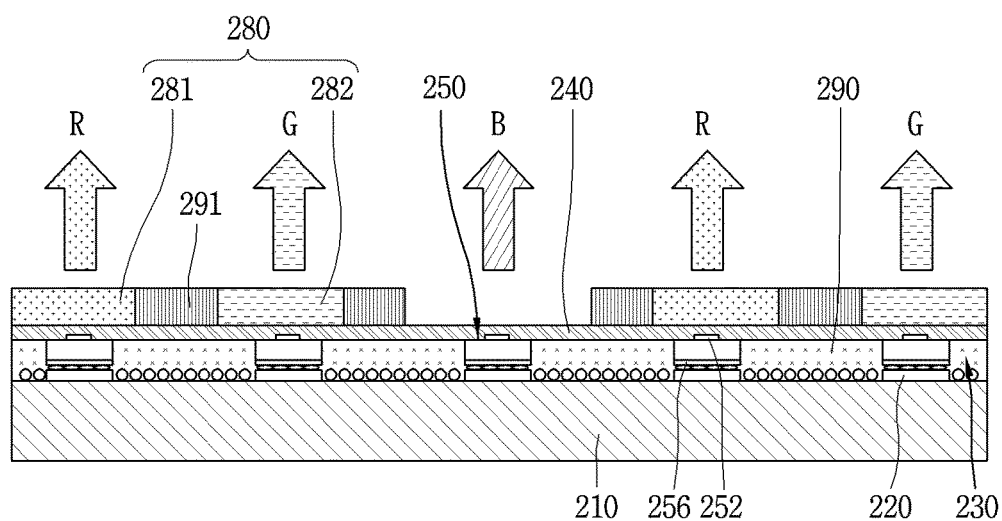
FIG. 8 is a cross-sectional view taken along line D-D in FIG. 7.
Figure 9:
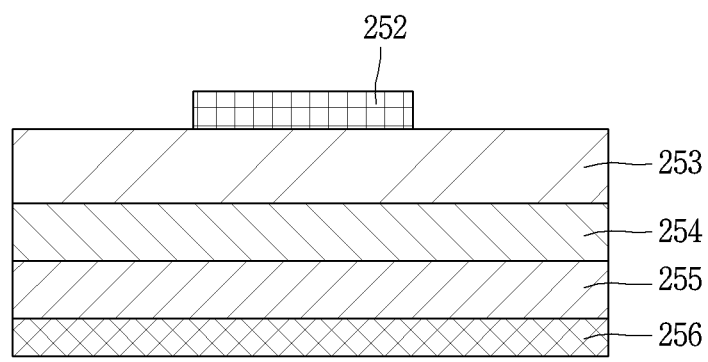
FIG. 9 is a conceptual view illustrating a vertical type semiconductor light-emitting diode in FIG. 8.

Next, FIG. 7 is a perspective view illustrating a display device using a semiconductor light-emitting diode according to another embodiment of the present disclosure. In addition, FIG. 8 is a cross-sectional view taken along line C-C in FIG. 7, and FIG. 9 is a conceptual view illustrating a vertical type semiconductor light-emitting diode in FIG. 8.

According to the drawings, the display device can use a passive matrix (PM) type of vertical semiconductor light-emitting diode. The display device may include a substrate 210, a first electrode 220, a conductive adhesive layer 230, a second electrode 240 and a plurality of semiconductor light-emitting diodes 250.

The substrate 210 as a wiring substrate disposed with the first electrode 220 may include polyimide (PI) to implement a flexible display device. In addition, any one may be used if it is an insulating and flexible material. The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similarly to a display device to which a flip chip type light-emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located when the first electrode 220 is located on the substrate 210, and then heat and pressure are applied to connect the semiconductor light-emitting diode 250 thereto, the semiconductor light-emitting diode 250 is electrically connected to the first electrode 220. At this time, the semiconductor light-emitting diode 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof. Furthermore, the anisotropic conductive film contains an adhesive component, and thus the conductive adhesive layer 230 implements a mechanical coupling as well as an electrical coupling between the semiconductor light-emitting diode 250 and the first electrode 220.

Thus, the semiconductor light-emitting diode 250 is placed on the conductive adhesive layer 230, thereby configuring a separate sub-pixel in the display device. The semiconductor light-emitting diode 250 has excellent luminance characteristics, and thus it is possible to configure individual sub-pixels even with a small size thereof. The size of the individual semiconductor light-emitting diode 250 may be less than 80 μm in the length of one side thereof, and formed with a rectangular or square shaped element. In case of a rectangular shaped element, the size thereof may be less than 20×80 μm.

The semiconductor light-emitting diode 250 may also be a vertical structure. In addition, a plurality of second electrodes 240 disposed in a direction of crossing the length direction of the first electrode 220, and electrically connected to the vertical semiconductor light-emitting diode 250 can be located between vertical semiconductor light-emitting diodes.

Referring to FIG. 9, the vertical semiconductor light-emitting diode includes a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof is electrically connected to the first electrode 220 by the conductive adhesive layer 230, and the n-type electrode 252 located at the top thereof is electrically connected to the second electrode 240 which will be described later. The electrodes are disposed in the upward/downward direction in the vertical semiconductor light-emitting diode 250, thereby providing a great advantage capable of reducing the chip size.

Referring again to FIG. 8, a phosphor layer 280 can be formed on one surface of the semiconductor light-emitting diode 250. For example, the semiconductor light-emitting diode 250 is a blue semiconductor light-emitting diode 251 that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light can be deposited on the blue semiconductor light-emitting diode 251 at a location implementing a red sub-pixel, and a green phosphor 282 capable of converting blue light into green (G) light can be deposited on the blue semiconductor light-emitting diode 251 at a location implementing a green sub-pixel. Furthermore, only the blue semiconductor light-emitting diode 251 can be solely used at a location implementing a blue sub-pixel. In this instance, the red (R), green (G) and blue (B) sub-pixels may implement one pixel.

However, the present disclosure is not limited to this, and another structure for implementing blue, red and green may be also applicable thereto as described above in a display device to which a flip chip type light-emitting device is applied.

Taking the present embodiment into consideration again, the second electrode 240 is located between the semiconductor light-emitting diodes 250, and electrically connected to the semiconductor light-emitting diodes 250. For example, the semiconductor light-emitting diodes 250 can be disposed in a plurality of rows, and the second electrode 240 may be located between the rows of the semiconductor light-emitting diodes 250.

Since a distance between the semiconductor light-emitting diodes 250 constituting individual pixels is sufficiently large, the second electrode 240 can be located between the semiconductor light-emitting diodes 250. In addition, the second electrode 240 can be formed with a bar-shaped electrode elongated in one direction, and disposed in a perpendicular direction to the first electrode.

Furthermore, the second electrode 240 can be electrically connected to the semiconductor light-emitting diode 250 by a connecting electrode protruded from the second electrode 240. More specifically, the connecting electrode may be an n-type electrode of the semiconductor light-emitting diode 250. For example, the n-type electrode is formed with an ohmic electrode for ohmic contact, and the second electrode covers at least part of the ohmic electrode by printing or deposition. Through this, the second electrode 240 can be electrically connected to the n-type electrode of the semiconductor light-emitting diode 250.

According to the drawing, the second electrode 240 is located on the conductive adhesive layer 230. According to circumstances, a transparent insulating layer containing silicon oxide (SiOx) can be formed on the substrate 210 formed with the semiconductor light-emitting diode 250. When the transparent insulating layer is formed and then the second electrode 240 is placed thereon, the second electrode 240 can be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light-emitting diode 250, the ITO material has a problem of bad adhesiveness with an n-type semiconductor. Accordingly, the second electrode 240 can be placed between the semiconductor light-emitting diodes 250, thereby obtaining an advantage in which the transparent electrode is not required. Accordingly, an n-type semiconductor layer and a conductive material having a good adhesiveness can be used as a horizontal electrode without being restricted by the selection of a transparent material, thereby enhancing the light extraction efficiency.

According to the drawing, a partition wall 290 is formed between the semiconductor light-emitting diodes 250. In other words, the partition wall 290 can be disposed between the vertical semiconductor light-emitting diodes 250 to isolate the semiconductor light-emitting diode 250 constituting individual pixels. In this instance, the partition wall 290 divides individual sub-pixels from one another, and can be formed as an integral body with the conductive adhesive layer 230. For example, a base member of the anisotropic conductive film may form the partition wall when the semiconductor light-emitting diode 250 is inserted into the anisotropic conductive film.

Furthermore, when the base member of the anisotropic conductive film is black, the partition wall 290 has reflective characteristics while at the same time increasing contrast with no additional black insulator. In another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light-emitting diodes 250, the partition wall 290 may be located between the semiconductor light-emitting diode 250 and second electrode 240. Accordingly, individual sub-pixels may be configured even with a small size using the semiconductor light-emitting diode 250, and a distance between the semiconductor light-emitting diodes 250 may be relatively sufficiently large to place the second electrode 240 between the semiconductor light-emitting diodes 250, thereby having the effect of implementing a flexible display device having a HD image quality. According to the drawing, a black matrix 291 can be disposed between each phosphor layer to enhance contrast. In other words, the black matrix 291 can enhance the contrast of luminance.

As described above, the semiconductor light-emitting diode 250 is located on the conductive adhesive layer 230, thereby constituting individual pixels on the display device. The semiconductor light-emitting diode 250 has excellent luminance characteristics, and thus it is possible to configure individual sub-pixels even with a small size thereof. As a result, it is possible to implement a full color display in which the sub-pixels of red (R), green (G) and blue (B) implement one pixel by means of the semiconductor light-emitting diode.

In addition, in the display device provided with a semiconductor light-emitting diode, a defect may exist in at least a part of a semiconductor light-emitting diode. The semiconductor light-emitting diode having a defect may be referred to as an NG cell. In the present invention, a semiconductor light-emitting diode structure of a novel structure for more easily exchanging a semiconductor light-emitting diode corresponding to an NG cell and a display device having the same are suggested.

Also, in the present invention, if a red semiconductor light-emitting diode has a physical characteristic different from that of the other semiconductor light-emitting diode of the other color, a semiconductor light-emitting diode structure of a novel structure, which uses the same manufacturing method, is provided. A novel structure of the present invention mixes a vertical type semiconductor light-emitting diode with a horizontal type semiconductor light-emitting diode, and includes a wiring structure that enables the mixture. The new structure of the present invention will now be described in detail.

Figure 10:
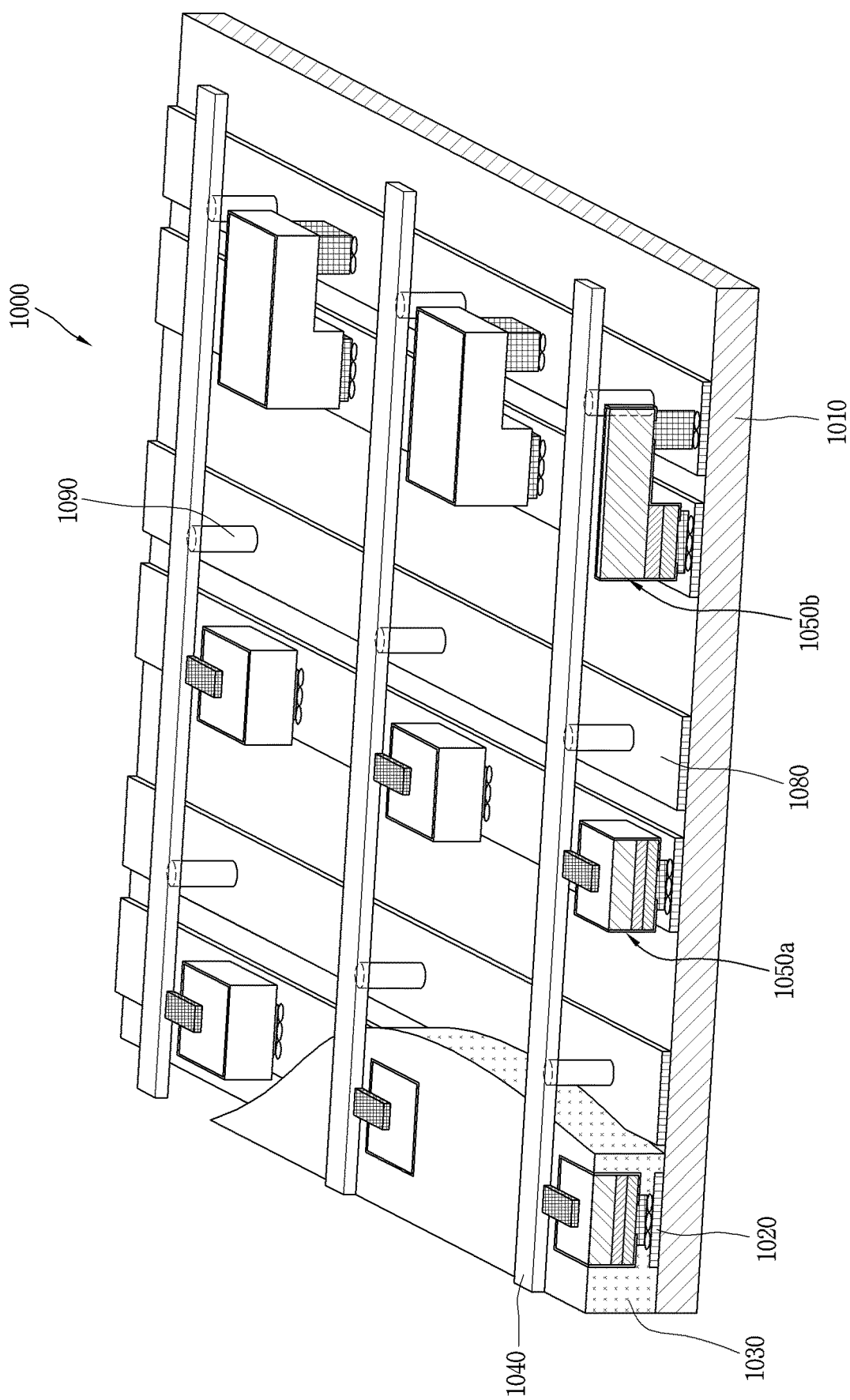
FIGS. 10 and 11 are an enlarged view and a plane view of portion "A" in FIG. 1 illustrating another embodiment of the present invention to which a semiconductor light-emitting element having a new structure is applied.
Figure 11:
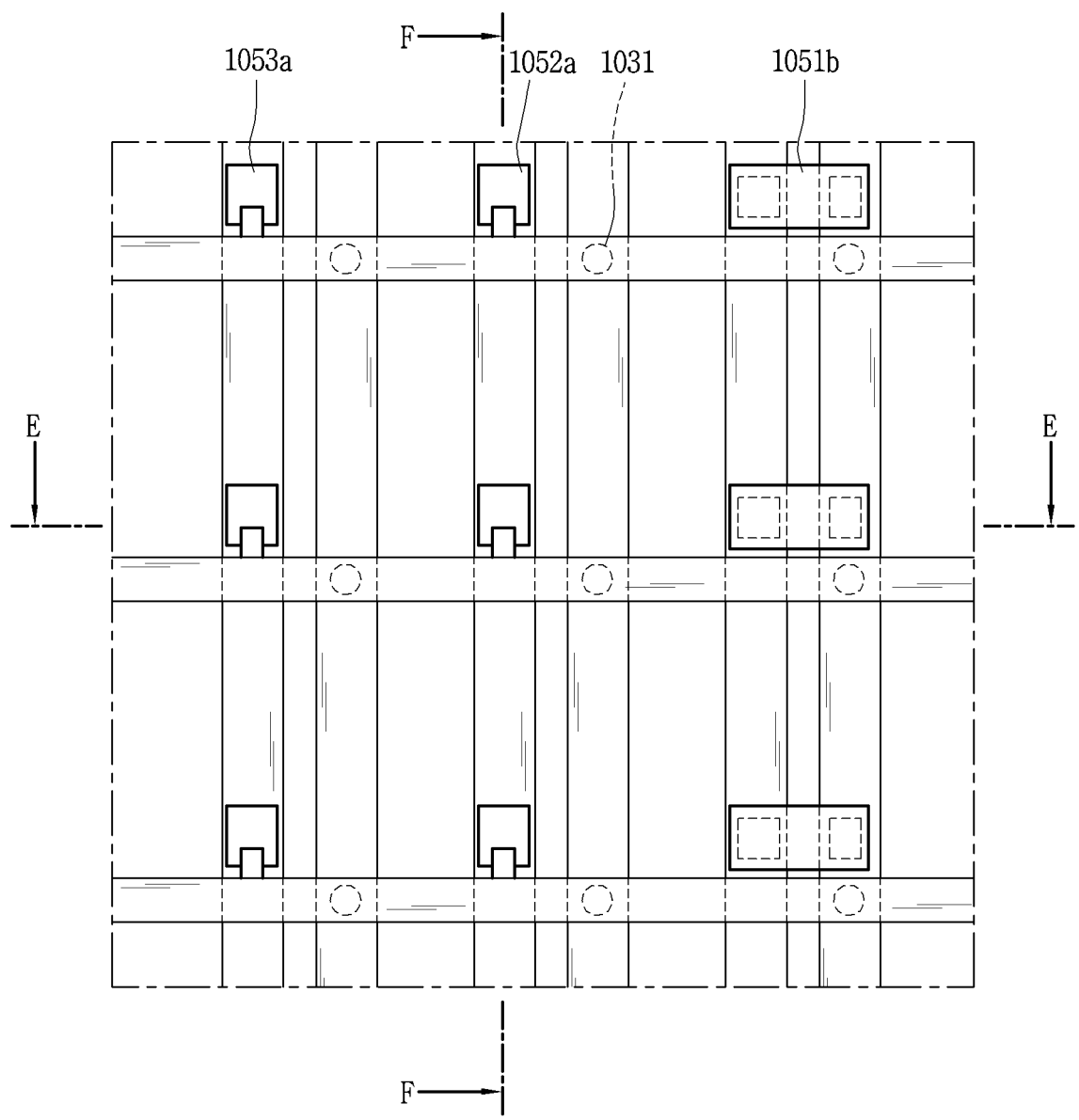
Figure 12:
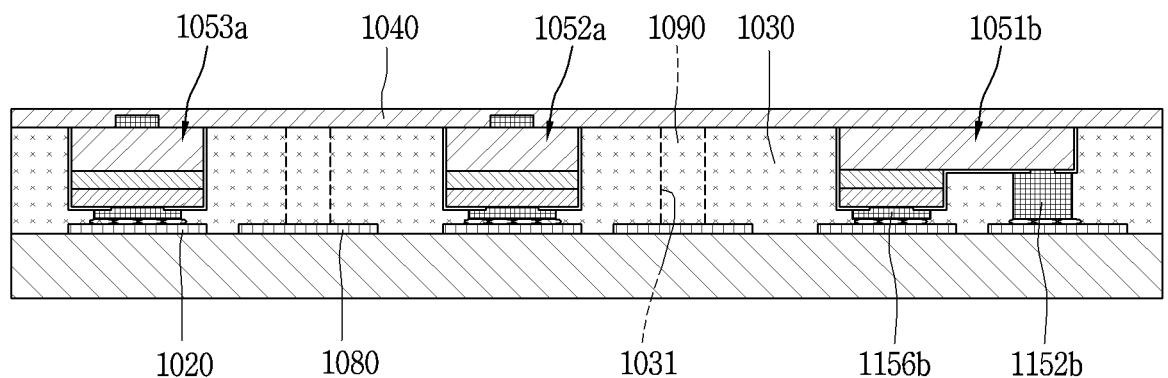
FIGS. 12 and 13 are cross-sectional views taken along line E-E and line F-F in FIG. 10.
Figure 13:
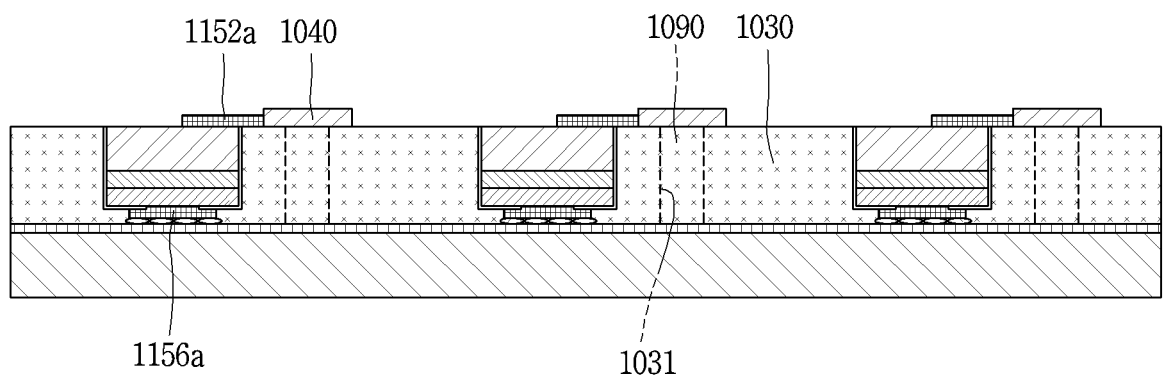
Figure 14:
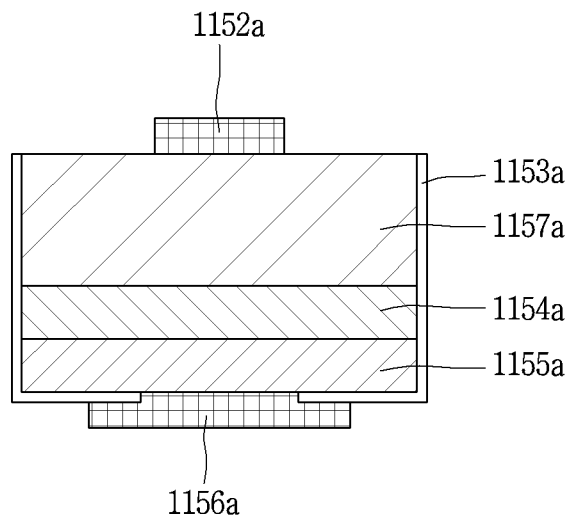
FIG. 14 is an enlarged view illustrating a vertical type semiconductor light-emitting diode in FIG. 10.
Figure 15:
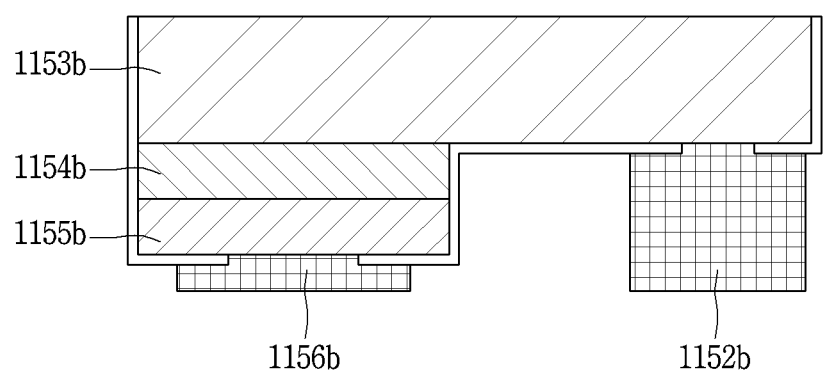
FIG. 15 is an enlarged view illustrating a horizontal type semiconductor light-emitting diode in FIG. 10.

Hereinafter, the display device to which a novel structure is applied will be described in more detail with reference to the accompanying drawings. In particular, FIGS. 10 and 11 are an enlarged view and a plane view of portion "A" in FIG. 1 illustrating another embodiment of the present invention to which a semiconductor light-emitting element having a new structure is applied, FIGS. 12 and 13 are cross-sectional views taken along line E-E and line F-F in FIG. 10, FIG. 14 is an enlarged view illustrating a vertical type semiconductor light-emitting diode in FIG. 10, and FIG. 15 is an enlarged view illustrating a horizontal type semiconductor light-emitting diode in FIG. 10;

In particular, FIGS. 10-15 illustrate a display device 1000 using a passive matrix (PM) type semiconductor light-emitting diode. However, an example described below can also be applicable to an active matrix (AM) type semiconductor light-emitting diode.

The display device 1000 includes a substrate 1010, a first wiring 1020, an adhesive layer 1030, a second wiring 1040, a third wiring 1080, a vertical type semiconductor light-emitting diode 1050a, and a horizontal type semiconductor light-emitting diode 1050b. In this instance, the first wiring 1020 and the second wiring 1040 may respectively include a plurality of electrode lines.

The substrate 1010 is a wiring substrate disposed with the first electrode 1020, and may include polyimide (PI) to implement a flexible display device. In addition, the substrate 1010 may be implemented as a non-flexible display or signage. Therefore, any one may be used as the substrate 1010 if it is an insulating and flexible material. In addition, the first wiring 1020 may be located on the substrate 1010, and formed with a bar-shaped electrode elongated in one direction. The first wiring 1020 may also perform the role of a data electrode.

Also, the adhesive layer 1030 is arranged between the substrate 1010 provided with the first wiring 1020 and the semiconductor light-emitting diode 1050. The adhesive layer 1030 allows the first wiring 1020 and the semiconductor light-emitting diode 1050 to be physically in contact with each other. Therefore, the semiconductor light-emitting diode 1050 and the first wiring 1020 can be connected with each other and electrically conducted with each other.

In addition, the adhesive layer 1030 may be the aforementioned anisotropic conductive film (ACF). As another example, the adhesive layer 1030 may be formed as a silver paste, a tin paste and a solder paste. The disclosure of the adhesive layer 1030 is only exemplary.

In addition, the first wiring 1020 and the second wiring 1040 are arranged by interposing the semiconductor light-emitting diodes therebetween. A plurality of second wirings 1040 are also disposed in a direction of crossing the length direction of the first wiring 1020. The first and second wirings 1020 and 1040 are electrically connected to the semiconductor light-emitting diodes 1050a and 1050b by the adhesive layer.

If the adhesive layer is formed of the anisotropic conductive film, the second wiring 1040 can be arranged on the anisotropic conductive film. That is, the anisotropic conductive film is arranged between the substrate 1010 and the second wiring 1040. Also, the plurality of semiconductor light-emitting diodes 1050 are coupled by the anisotropic conductive film and electrically connected with the first wiring 1020 and the second wiring 1040.

In addition, the first wiring 1020 is connected with first conductive electrodes of the vertical type semiconductor light-emitting diodes under the vertical type semiconductor light-emitting diodes, and the second wiring 1040 is arranged to cross the first wiring 1020 and is electrically connected with second conductive electrodes of the vertical type semiconductor light-emitting diodes over the vertical type semiconductor light-emitting diodes.

Further, the vertical type semiconductor light-emitting diodes 1050a form a plurality of columns in parallel with a plurality of electrode lines provided in the first wiring 1020. Also, the vertical type semiconductor light-emitting diodes 1050a form a plurality of rows in parallel with a plurality of electrode lines provided in the second wiring 1040. However, the present invention is not limited to this case. For example, the plurality of vertical type semiconductor light-emitting diodes 1050a may form a plurality of columns along the second wiring 1040.

Also, a transparent insulating layer containing silicon oxide (SiOx) can be formed on the substrate 1010 formed with the semiconductor light-emitting diode 1050. When the transparent insulating layer is formed and then the second wiring 1040 is placed thereon, the second wiring 1040 is located on the transparent insulating layer. Furthermore, the second wiring 1040 can be formed to be spaced apart from the polyimide or the transparent insulating layer.

As shown in the drawing, the vertical type semiconductor light-emitting diodes 1050 include a green semiconductor light-emitting diode 1052a and a blue semiconductor light-emitting diode 1053a. In this instance, structures of the green semiconductor light-emitting diode 1052a and the blue semiconductor light-emitting diode 1053a, will be described with reference to FIG. 14.

The green semiconductor light-emitting diode 1052a and the blue semiconductor light-emitting diode 1053a can be implemented as light-emitting diodes of high power, which emits blue or green light by containing GaN together with In and/or Al as a main material. As such an example, the plurality of light-emitting diodes 1050 may be GaN thin films formed of various layers such as n-Gan, p-Gan, AlGaN, and InGan.

Also, the semiconductor light-emitting diode may be a micro light-emitting diode chip. In this instance, the micro light-emitting diode chip may have a sectional area smaller than a size of an emission are in a sub-pixel. As such an example, the semiconductor light-emitting diode may have a scale of 1 micrometer to 100 micrometers.

Referring to FIG. 14, for example, the vertical type semiconductor light-emitting diode 1050a includes a first conductive electrode 1156a, a first conductive semiconductor layer 1155a formed with the first conductive electrode 1156a, an active layer 1154a formed on the first conductive semiconductor layer 1155a, a second conductive semiconductor layer 1153a formed on the active layer 1154a, and a second conductive electrode 1152a formed on the second conductive semiconductor layer 1153a.

The first conductive semiconductor layer 1155a and the second conductive semiconductor layer 1153a overlap with each other, the second conductive electrode 1152a is disposed on an upper surface of the second conductive semiconductor layer 1153a, and the first conductive electrode 1156a is disposed on a lower surface of the first conductive semiconductor layer 1155a. In this instance, the upper surface of the second conductive semiconductor layer 1153a may be one surface of the second conductive semiconductor layer 1153a farthest from the first conductive semiconductor layer 1155a, and the lower surface of the first conductive semiconductor layer 1155a may be one surface of the first conductive semiconductor layer 1155a farthest from the second conductive semiconductor layer 1153a. Thus, the first conductive electrode 1156a and the second conductive electrode 1152a are respectively disposed on the upper and lower sides of the first conductive semiconductor layer 1155a and the second conductive semiconductor layer 1153a by interposing them therebetween.

Also, a passivation layer 1157a is provided at the outermost of the semiconductor light-emitting diode 1050a, whereby stabilization characteristic of the semiconductor light-emitting diode 1050a can be improved. The passivation layer 1157a may surround the first conductive semiconductor layer 1155a, the active layer 1154a and the second conductive semiconductor layer 1153a of the semiconductor light-emitting diode 1050a.

Referring to FIG. 14 together with FIGS. 10 through 13, the lower surface of the first conductive semiconductor layer 1155a may be a surface closest to the wiring substrate, and the upper surface of the second conductive semiconductor layer may be a surface farthest from the wiring substrate. More specifically, the first conductive electrode 1156a and the first conductive semiconductor layer 1155a can be a p-type electrode and a p-type semiconductor layer, respectively, and the second conductive electrode 1152a and the second conductive semiconductor layer 1153a can be an n-type electrode and an n-type semiconductor layer, respectively.

However, the present invention is not limited to this case, and the first conductive electrode and the first conductive semiconductor layer may be an n-type electrode and an n-type semiconductor layer, respectively, and the second conductive electrode and the second conductive semiconductor layer may be a p-type electrode and a p-type semiconductor layer, respectively. The p-type semiconductor layer may be a P-type GaN layer, and the n-type semiconductor layer may be an N-type GaN layer.

In this instance, the p-type electrode located at the lower portion is electrically connected to the first wiring 1020 by the conductive adhesive layer 1030, and the n-type electrode located at the upper portion is electrically connected to the second wiring 1040. At this time, the p-type electrode may include a plurality of metal layers made of different metals. For example, a plurality of metal layers made of Ti, Pt, Au, Ti, Cr and the like may be deposited to form the p-type electrode.

In this example, a third wiring 1080 electrically connected with the second wiring 1040 is formed on the substrate, whereby the horizontal type semiconductor light-emitting diode 1050b is combined with the aforementioned vertical type semiconductor light-emitting diode 1050a to implement a new type display device. In more detail, the display device includes a unit pixel that outputs blue, green and red, wherein the unit pixel may include the vertical type semiconductor light-emitting diode and the horizontal type semiconductor light-emitting diode. According to the drawings, the horizontal type semiconductor light-emitting diode 1050b may include a red semiconductor light-emitting diode 1051b that emits red light.

Referring to FIG. 15, the horizontal type semiconductor light-emitting diode includes a first conductive electrode 1156b, a first conductive semiconductor layer 1155b formed with the first conductive electrode 1156b, an active layer 1154b formed on the first conductive semiconductor layer 1155b, a second conductive semiconductor layer 1153b formed on the active layer 1154b, and a second conductive electrode 1152b formed on the second conductive semiconductor layer 1153b and spaced apart from the first conductive electrode 1156b in a horizontal direction. In this instance, the second conductive electrode may be arranged on one surface of the second conductive semiconductor layer 1153b, and an undoped semiconductor layer may be formed on the other surface of the second conductive semiconductor layer 1153b. Also, a passivation layer 1157b may surround the first conductive semiconductor layer 1155b, the active layer 1154b, and the second conductive semiconductor layer 1153b.

Also, the first conductive electrode 1156b and the first conductive semiconductor layer 1155b may be a p-type electrode and a p-type semiconductor layer, respectively, and the second conductive electrode 1152b and the second conductive semiconductor layer 1153b may be an n-type electrode and an n-type semiconductor layer, respectively. However, the present invention is not limited to this case, and the first conductive electrode and the first conductive semiconductor layer may be an n-type electrode and an n-type semiconductor layer, respectively, and the second conductive electrode and the second conductive semiconductor layer may be a p-type electrode and a p-type semiconductor layer, respectively. The p-type semiconductor layer may be a P-type GaAs layer, and the n-type semiconductor layer may be an N-type GaAs layer.

Also, according to another embodiment of the present invention, impurities can be injected to an intrinsic or doped semiconductor substrate to form the first conductive semiconductor layer and the second conductive semiconductor layer. Also, a p-n junction area formed by the injection of the impurities serve as the active layer.

Referring to FIG. 15 together with FIGS. 10 through 13, the first wiring 1020 and the third wiring 1080 can be arranged to be connected with the first conductive electrode 1156b and the second conductive electrode 1156a of the horizontal type semiconductor light-emitting diode on the substrate. Since the first wiring 1020 and the third wiring 1080 are arranged on the same surface of the substrate, they can be formed of the same material.

According to the drawings, the horizontal type semiconductor light-emitting diode is arranged between the vertical type semiconductor light-emitting diodes along one direction. As such an example, the first wiring 1020 may include a plurality of lines, and a vertical type blue semiconductor light-emitting diode 1053a and a vertical type green semiconductor light-emitting diode 1052a can respectively be arranged on the lines corresponding to blue and green among the plurality of lines at preset intervals.

Also, a horizontal type red semiconductor light-emitting diode 1051b can be arranged on the line corresponding to red among the plurality of lines. For example, the second wiring 1040 may be comprised of a line, and the horizontal type semiconductor light-emitting diode is arranged between the vertical type semiconductor light-emitting diodes along the second wiring 1040. According to this structure, the vertical type blue semiconductor light-emitting diode 1053a, the vertical type green semiconductor light-emitting diode 1052a and the horizontal type red semiconductor light-emitting diode 1051b may sequentially be arranged along the second wiring 2040.

For a competitive price of the display device using the semiconductor light-emitting diode, division of a light-emitting diode chip wafer is required, and a vertical type structure is more favorable than a horizontal type structure (flip-chip structure) in view of multiple divisions. However, in case of the vertical type semiconductor light-emitting diode, heat treatment of 400° C. or more for n-electrode ohmic contact is required, whereas a problem occurs in that a special material should be used to allow a polymer layer used during division to endure this temperature in case of the red semiconductor light-emitting diode. This problem can be solved using the red semiconductor light-emitting diode of the horizontal type structure in the same manner as this example.

According to the drawings, the third wiring 1080 is formed as a wiring allowing the horizontal type semiconductor light-emitting diode to be used together with the vertical type semiconductor light-emitting diode. The third wiring 1080 is arranged in parallel with the first wiring 1020, and the second wiring 1040 is formed to cross the first wiring 1020 and the third wiring 1080.

In more detail, the adhesive layer 1030 can be provided with through holes 1031 formed along the second wiring 1040 at preset intervals. That is, the through holes 1031 are overlapped with the second wiring 1040, and are sequentially arranged along the second wiring 1040. In more detail, the through holes 1031 can be arranged at a point where the second wiring 1040 crosses the third wiring 1080. A conductive material can be charged in the through holes 1031, whereby a conductive path portion 1090, which connects the second wiring 1040 with the third wiring 1080, is formed.

As another example, the vertical type semiconductor light-emitting diode may be coupled to the first wiring through self-assembly or soldering without the adhesive layer. In this instance, an insulating layer that fills a space between the vertical type semiconductor light-emitting diodes may be formed on the substrate, and through holes may be formed in the insulating layer to electrically connect the second wiring with the third wiring.

Also, the horizontal type semiconductor light-emitting diode may be formed longitudinally in parallel with the second wiring 1040 rather than the first wiring 1020. According to this structure, the first conductive electrode 1156b and the second conductive electrode 1152b of the horizontal type semiconductor light-emitting diode can respectively be arranged at positions overlapped with the first wiring 1020 and the second wiring 1080. In addition, the first conductive electrode 1156b and the second conductive electrode 1152b can electrically be connected with each other through an anisotropic conductive medium of the first and third wirings 1020 and 1080 and the adhesive layer. At this time, the first wiring 1020 and the third wiring 1080 can be formed to have the same height extended from the substrate 1010.

Further, the horizontal type semiconductor light-emitting diode 1050b can be formed to be thicker than the vertical type semiconductor light-emitting diode 1050a. As a result, the upper surface of the horizontal type semiconductor light-emitting diode 1050b can be arranged to be farther away from the substrate than that of the vertical type semiconductor light-emitting diode 1050a. According to this structure, after the vertical type semiconductor light-emitting diode 1050a is transferred onto the substrate, the horizontal type semiconductor light-emitting diode can easily be transferred onto the substrate onto which the vertical type semiconductor light-emitting diode 1050a is transferred.

At this time, the horizontal type semiconductor light-emitting diode 1050b can be coupled to the first wiring 1020 and the third wiring 1080 by another method instead of the adhesive layer 1030. For example, after the adhesive layer is removed from the portion corresponding to the horizontal type semiconductor light-emitting diode, the horizontal type semiconductor light-emitting diode can be coupled to the first wiring and the third wiring through soldering or the like. Afterwards, the removed portion can be charged with the insulating layer. Therefore, a boundary between the adhesive layer and the insulating layer can be formed. In this instance, if the adhesive layer is made of the same material as that of the insulating layer, the boundary can be bonded by thermal compression bonding or the like.

In addition, the display device that combines the vertical type semiconductor light-emitting diode with the horizontal type semiconductor light-emitting diode like the present invention can be applied to repair of the semiconductor light-emitting diode. Hereinafter, another embodiment of the present invention will be described.

Figure 16:
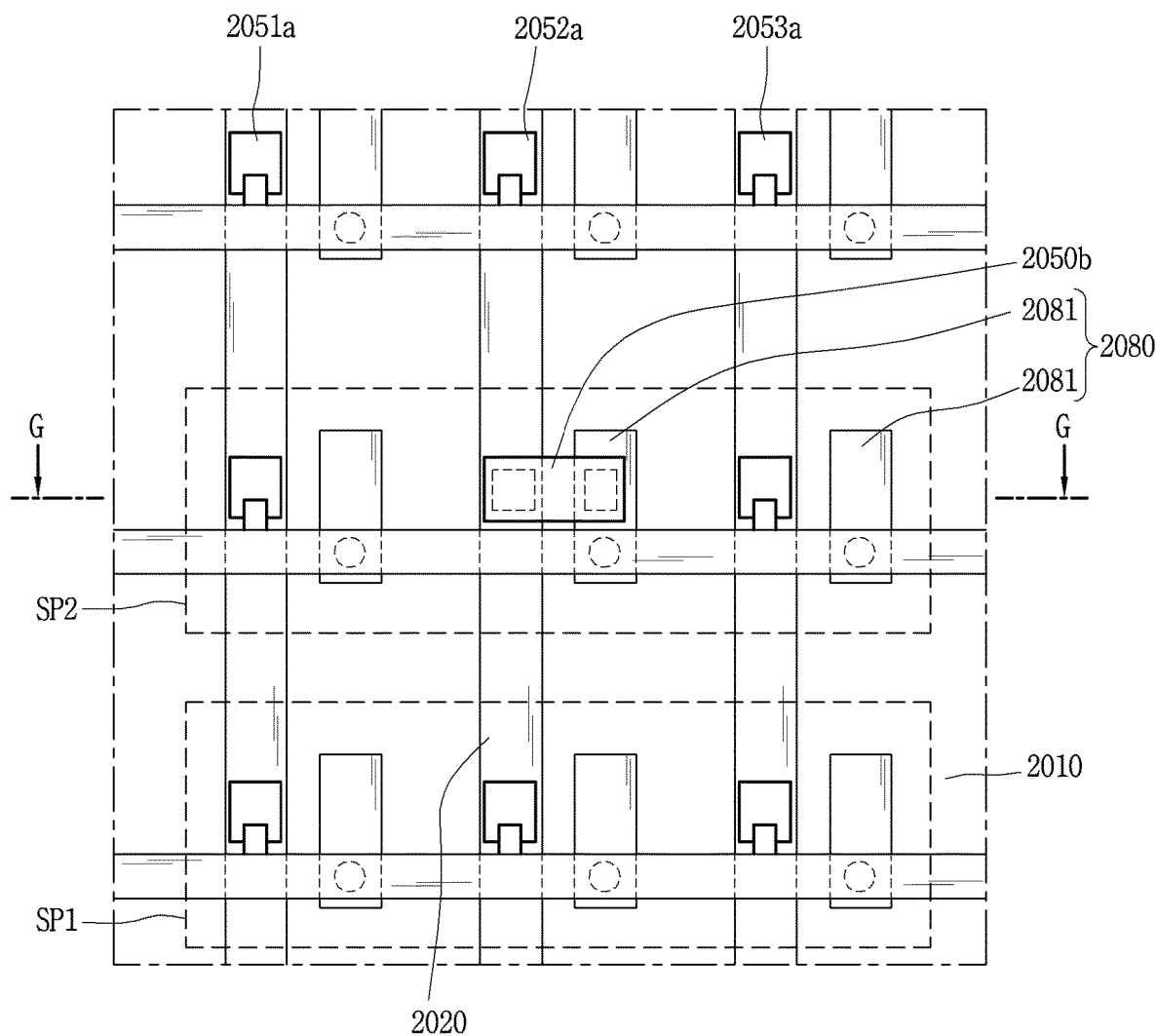
FIG. 16 is a plane view illustrating a display device according to another embodiment of the present invention.
Figure 17:
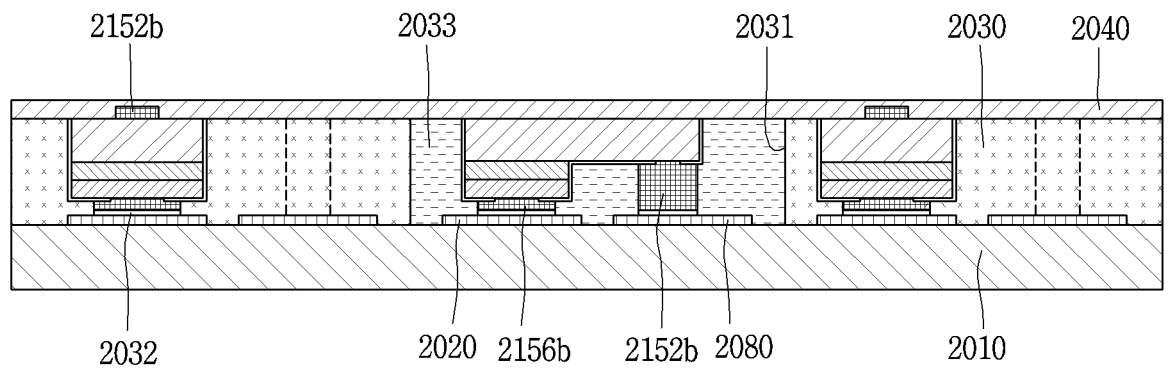
FIG. 17 is a cross-sectional view taken along line G-G in FIG. 16.
Figure 18:
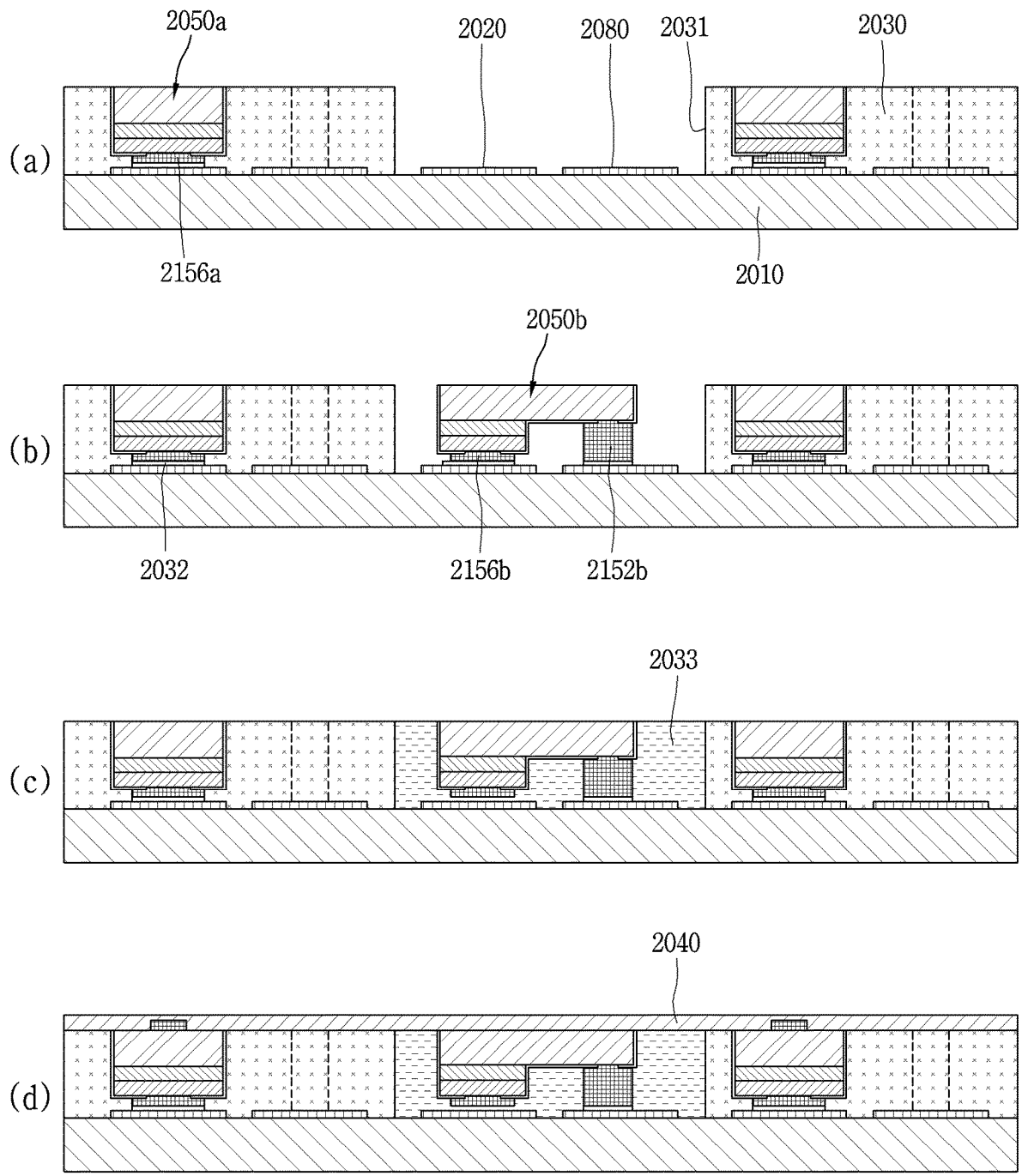
FIG. 18 is a process view illustrating a method of manufacturing a display device in FIG. 16.

Next, FIG. 16 is a plane view illustrating a display device according to another embodiment of the present invention, FIG. 17 is a cross-sectional view taken along line G-G in FIG. 16, and FIG. 18 is a process view illustrating a method of manufacturing a display device in FIG. 16. In the examples of FIGS. 16 and 17, the same reference numerals will be given to the same elements as those of the examples described with reference to FIGS. 10 to 15, and their description will be substituted by the earlier description. Specifically, structures of the substrate, the first wiring, the second wiring, the vertical type semiconductor light-emitting diode and the horizontal type semiconductor light-emitting diode are the same as those of the examples described with reference to FIGS. 10 to 15.

Referring to these drawings, at least three adjacent vertical type semiconductor light-emitting diodes 2051*a*, 2052*a* and 2053*a* may constitute one unit pixel for color display. For example, one unit pixel includes a vertical type red semiconductor light-emitting diode 2051*a*, a vertical type green semiconductor light-emitting diode 2051*b*, and a vertical type blue semiconductor light-emitting diode 2051*c*, which are adjacent to one another, and may further include a white semiconductor light-emitting diode for luminance improvement. In this instance, the structure of the vertical type semiconductor light-emitting diode is the same as that of the vertical type semiconductor light-emitting diode described with reference to FIG. 14, and its description will be substituted by the earlier description. According to the drawings, the third wiring 2080 may include a plurality of wiring parts 2081 sequentially arranged along the first wiring. The wiring parts 2081 are arranged on the same plane as that of the first wiring 2020, and can be extended in parallel with the first wiring 2020. Since the first wiring 2020 and the wiring parts 2081 are arranged on the same plane of the substrate 2010, they can be formed of the same material.

Also, the first wiring 2020 and the wiring parts 2081 can be arranged to be connected with the first conductive type electrode 2156*b* and the second conductive type electrode 2152*b* of the horizontal type semiconductor light-emitting-diode on the substrate. In this instance, the structure of the horizontal type semiconductor light-emitting diode 2050*b* is the same as that of the horizontal type semiconductor light-emitting diode described with reference to FIG. 15, and its description will be substituted by the earlier description.

In this instance, the horizontal type semiconductor light-emitting diode 2050*b* can be inserted as a new semiconductor light-emitting diode when the vertical type semiconductor light-emitting diode is a poor diode. For example, if a diode, which needs to be repaired, among the semiconductor light-emitting diodes coupled to the substrate, is detected, the detected diode can be removed and then the horizontal type semiconductor light-emitting diode 2050*b* can be coupled to the corresponding position. Therefore, the unit pixel may include a first unit pixel SP1 and a second unit pixel SP2. The first unit pixel SP1 may be a unit pixel that includes the vertical type semiconductor light-emitting diodes, and the second unit pixel SP2 may be a unit pixel that includes the vertical type semiconductor light-emitting diodes and the horizontal type semiconductor light-emitting diodes. At this time, the horizontal type semiconductor light-emitting diode 2050*b* repairs the vertical type semiconductor light-emitting diode, which has a defect, within the second unit pixel SP2.

According to the drawings, the horizontal type semiconductor light-emitting diode 2050*b* can be arranged between the vertical type semiconductor light-emitting diodes along one direction. For example, a vertical type red semiconductor light-emitting diode 2051*a*, a vertical type green semiconductor light-emitting diode 2051*b* and a vertical type blue semiconductor light-emitting diode 2051*c* may sequentially be arranged along the second wiring 2040. Among these vertical type semiconductor light-emitting diodes, the vertical type semiconductor light-emitting diode having a defect is replaced with the horizontal type semiconductor light-emitting diode 2050*a* of a corresponding color.

Therefore, in this example, the horizontal type red semiconductor light-emitting diode, the horizontal type blue semiconductor light-emitting diode or the horizontal type green semiconductor light-emitting diode can be arranged in a cell that removes the vertical type semiconductor light-emitting diode of a corresponding color from the substrate unlike the aforementioned example.

As another example, this example can be combined with the aforementioned example. In this instance, unlike the aforementioned example, the horizontal type semiconductor light-emitting diode is arranged at the position corresponding to red, and the horizontal type semiconductor light-emitting diode further includes a horizontal type blue semiconductor light-emitting diode or a horizontal type green semiconductor light-emitting diode. The horizontal type blue semiconductor light-emitting diode or the horizontal type green semiconductor light-emitting diode can be arranged in a cell that removes the vertical type semiconductor light-emitting diode from the substrate.

In addition, the structure of the aforementioned adhesive layer or insulating layer can be applied to this example. As an example, the vertical type semiconductor light-emitting diodes 2051*a*, 2052*a* and 2053*a* can be coupled to the first wiring 2020 through self-assembly or soldering without the adhesive layer. That is, the first conductive electrode 2156*b* of the vertical type semiconductor light-emitting diode is electrically connected with the first wiring 2020 by using a plating or solder material 2031 as a medium. An insulating layer 2030 that fills the space between the vertical type semiconductor light-emitting diodes is formed on the substrate, and the solder material 2031 can be arranged in the insulating layer 2030 so that the second wiring is electrically connected with the third wiring.

A removal groove 2031 from which the vertical type semiconductor light-emitting diode is removed is formed in the insulating layer 2030, and the horizontal type semiconductor light-emitting diode can be inserted to the removal groove 2031. The removal groove is charged by an insulating material to form an additional insulating layer 2033. The additional insulating layer 2033 is formed of the same material as that of the insulating layer 2030, whereby the additional insulating layer 2033 and the insulating layer 2030 may be a single layer without any boundary.

Also, the horizontal type semiconductor light-emitting diode may be formed longitudinally in parallel with the second wiring 2040 rather than the first wiring 2020. According to this structure, the first conductive electrode 2156*b* and the second conductive electrode 2152*b* of the horizontal type semiconductor light-emitting diode can respectively be arranged at positions overlapped with the first wiring 2020 and the second wiring 2080. At this time, the first wiring 2020 and the third wiring 2080 can be formed to have the same height extended from the substrate 2010, and the horizontal type semiconductor light-emitting diode can be formed to be thicker than the vertical type semiconductor light-emitting diode. As a result, the upper surface of the horizontal type semiconductor light-emitting diode can be arranged to be farther away from the substrate than that of the vertical type semiconductor light-emitting diode. According to this structure, after the vertical type semiconductor light-emitting diode is transferred onto the substrate, the light-emitting diode having a defect can be removed and then easily be repaired by the horizontal type semiconductor light-emitting diode.

In more detail, referring to FIG. 18, when the vertical type semiconductor light-emitting diodes 2050*a* are coupled to the first wiring 2020, the detected semiconductor light-emitting diodes having a defect are removed ((a) of FIG. 18). The removal groove 2031 can be formed in the insulating layer 2030 by the above removal, and the horizontal type semiconductor light-emitting diode 2050*b* is inserted in the removal groove 2031 ((b) of FIG. 18).

To insert the horizontal type semiconductor light-emitting diode 2050b into the removal groove 2031 without any problem, the horizontal type semiconductor light-emitting diode 2050b can be formed to be thicker than the vertical type semiconductor light-emitting diode 2050a. At this time, the first conductive electrode 2156b and the second conductive electrode 2152b of the horizontal type semiconductor light-emitting diode 2050b are electrically connected with the first wiring 2020 and the third wiring 2080, respectively.

This connection may be implemented using a solder or plating as a medium. Afterwards, the removal groove is charged with an insulating material and incorporated into the insulating layer 2030 ((c) of FIG. 18), and the second wiring 2040 is formed on the insulating layer 2030 ((d) of FIG. 18).

As described above, the horizontal structure is used by a repair chip, and both 'n' and 'p' wiring electrodes exist on the wiring substrate for horizontal type repair chip connection. The semiconductor light-emitting diode having a defect can be exchanged without any problem by the connection structure of the upper wiring and the 'n' wiring electrode. Moreover, the process cost can be reduced.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A display device comprising:
   a plurality of vertical type semiconductor light-emitting diodes;
   a plurality of horizontal type semiconductor light-emitting diodes;
   a first wiring formed on a substrate and including a plurality of electrode lines, a first electrode line being connected with first conductive electrodes of the plurality of vertical type semiconductor light-emitting diodes and a second electrode line being connected with first conductive electrodes of the plurality of horizontal type semiconductor light-emitting diodes;
   a second wiring spaced apart from and crossing the first wiring and electrically connected with second conductive electrodes of the plurality of vertical type semiconductor light-emitting diodes; and
   a third wiring formed on the substrate, electrically connected with the second wiring, and connected with second conductive electrodes of the plurality of horizontal type semiconductor light-emitting diodes,
   wherein the display device further comprises:
   an insulating layer filling a space between the plurality of vertical type semiconductor light-emitting diodes formed on the substrate; and
   a removal groove formed in the insulating layer,
   wherein the insulating layer includes through holes formed to electrically connect the second wiring with the third wiring, and
   wherein the plurality of horizontal type semiconductor light-emitting diodes and an additional insulating layer are disposed in the removal groove.

2. The display device of claim 1, wherein the plurality of horizontal type semiconductor light-emitting diodes are arranged between the plurality of vertical type semiconductor light-emitting diodes along one direction.

3. The display device of claim 2, wherein the third wring is arranged in parallel with the first wiring.

4. The display device of claim 3, wherein the second wiring crosses the first wiring and the third wiring.

5. The display device of claim 3, wherein the plurality of horizontal type semiconductor light-emitting diode are arranged between the plurality of vertical type semiconductor light-emitting diodes along the second wiring.

6. The display device of claim 1, wherein the third wiring includes a plurality of wiring parts sequentially arranged along the first wiring.

7. The display device of claim 6, wherein the wiring parts are arranged on a same plane as that of the first wiring.

8. The display device of claim 1, wherein the through holes are overlapped with the second wiring, and are sequentially arranged along the second wiring.

9. The display device of claim 1, further comprising:
   a first unit pixel including first vertical type semiconductor light-emitting diodes among the plurality of vertical type semiconductor light-emitting diodes, and
   a second unit pixel including second vertical type semiconductor light-emitting diodes among the plurality of vertical type semiconductor light-emitting diodes and a corresponding horizontal type semiconductor light-emitting diode among the plurality of horizontal type semiconductor light-emitting diodes.

10. The display device of claim 9, wherein the corresponding horizontal type semiconductor light-emitting diode repairs a defective second vertical type semiconductor light-emitting diode having a defect within the second unit pixel.

11. The display device of claim 1, wherein the plurality of horizontal type semiconductor light-emitting diodes are formed longitudinally in parallel with the second wiring rather than the first wiring.

12. The display device of claim 1, further comprising:
   a unit pixel outputting blue, green and red, and including corresponding vertical type semiconductor light-emitting diodes and a corresponding horizontal type semiconductor light-emitting diode.

13. The display device of claim 12, wherein the plurality of vertical type semiconductor light-emitting diodes include a blue semiconductor light-emitting diode emitting blue light and a green semiconductor light-emitting diode emitting green light, and the plurality of horizontal type semiconductor light-emitting diode includes a red semiconductor light-emitting diode emitting red light.

14. The display device of claim 13, wherein the plurality of horizontal type semiconductor light-emitting diode further includes a blue semiconductor light-emitting diode or a green semiconductor light-emitting diode, and the blue semiconductor light-emitting diode or the green semiconductor light-emitting diode is arranged in a cell that removes the plurality of vertical type semiconductor light-emitting diode from the substrate.

15. The display device of claim 1, wherein the plurality of horizontal type semiconductor light-emitting diodes are thicker than the plurality of vertical type semiconductor light-emitting diodes.

16. The display device of claim 15, wherein an upper surface of a corresponding horizontal type semiconductor light-emitting diode is arranged to be farther away from the substrate than that of a corresponding vertical type semiconductor light-emitting diode.

17. The display device of claim 1, wherein the plurality of vertical type semiconductor light-emitting diodes form a plurality of columns in parallel with the plurality of electrode lines provided in the first wiring.

18. The display device of claim 1, wherein the plurality of vertical type semiconductor light-emitting diodes form a plurality of rows in parallel with the plurality of electrode lines provided in the second wiring.

19. The display device of claim 1, wherein the plurality of vertical type semiconductor light-emitting diodes include first vertical type semiconductor light-emitting diodes emitting a first color and second vertical type semiconductor light-emitting diodes emitting a second color,
   wherein the first electrode line is connected with first conductive electrodes of the first vertical type semiconductor light-emitting diodes and a third electrode line is connected with first conductive electrodes of the second horizontal type semiconductor light-emitting diodes, and
   wherein the plurality of horizontal type semiconductor light-emitting element diodes emit a third color.

* * * * *